(12) United States Patent
Tondu et al.

(10) Patent No.: US 10,582,572 B2
(45) Date of Patent: Mar. 3, 2020

(54) HEATED GLASS PANEL FOR ELECTROMAGNETIC SHIELDING

(71) Applicant: SAINT-GOBAIN GLASS FRANCE, Courbevoie (FR)

(72) Inventors: Thomas Tondu, Saint Martin d'Abbat (FR); Jean-Benoît Mayeux, Saint Jean de Braye (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 479 days.

(21) Appl. No.: 15/517,628

(22) PCT Filed: Oct. 7, 2015

(86) PCT No.: PCT/FR2015/052697
§ 371 (c)(1),
(2) Date: Apr. 7, 2017

(87) PCT Pub. No.: WO2016/055735
PCT Pub. Date: Apr. 14, 2016

(65) Prior Publication Data
US 2018/0270912 A1 Sep. 20, 2018

(30) Foreign Application Priority Data
Oct. 10, 2014 (FR) ...................................... 14 59738

(51) Int. Cl.
*H05B 3/84* (2006.01)
*B32B 17/10* (2006.01)
*H05K 9/00* (2006.01)

(52) U.S. Cl.
CPC ......... *H05B 3/84* (2013.01); *B32B 17/10045* (2013.01); *B32B 17/10055* (2013.01);
(Continued)

(58) Field of Classification Search
CPC .............. H05B 3/84–86; C03C 17/3668–3697
See application file for complete search history.

(56) References Cited

U.S. PATENT DOCUMENTS 4,998,392 A * 3/1991 Massarelli ............ E06B 3/5427
156/108
5,336,965 A * 8/1994 Meyer .................... B32B 17/10
313/498

(Continued)

FOREIGN PATENT DOCUMENTS

| CN | 202396012 U | 8/2012 |
| EP | 0 281 278 A2 | 9/1988 |
| FR | 2 862 961 A | 6/2005 |

OTHER PUBLICATIONS

International Search Report as issued in International Patent Application No. PCT/FR2015/052697, dated Feb. 1, 2016.

*Primary Examiner* — Michael A LaFlame, Jr.
(74) *Attorney, Agent, or Firm* — Pillsbury Winthrop Shaw Pittman LLP

(57) ABSTRACT

A glazing unit providing heating and electromagnetic shielding functions, including at least one substrate, a heating layer deposited on one of the faces of the substrate, and an electromagnetic shield, wherein the electromagnetic shield comprises an electrically conductive coating that covers a portion of the heating layer, the heating layer being electrically insulated from the coating by electrically insulating components.

21 Claims, 3 Drawing Sheets

(52) U.S. Cl.
CPC .... *B32B 17/10761* (2013.01); *H05B 2203/01* (2013.01); *H05B 2203/013* (2013.01); *H05K 9/00* (2013.01)

(56) References Cited

U.S. PATENT DOCUMENTS

| | | | |
|---|---|---|---|
| 2003/0087048 A1* | 5/2003 | Chaussade | B64C 1/1492 428/34 |
| 2007/0259137 A1* | 11/2007 | Busick | H05B 3/84 428/34 |
| 2010/0212959 A1* | 8/2010 | Flick | B32B 17/10036 174/84 R |
| 2011/0236663 A1* | 9/2011 | Fleury | B32B 17/10018 428/216 |
| 2013/0228365 A1 | 9/2013 | Uprety et al. | |
| 2015/0171624 A1* | 6/2015 | Duarte | H02H 9/02 361/49 |
| 2019/0273302 A1* | 9/2019 | Dai | H01Q 1/325 |

\* cited by examiner

HEATED GLASS PANEL FOR ELECTROMAGNETIC SHIELDING

CROSS-REFERENCE TO RELATED APPLICATIONS

This application is the U.S. National Stage of PCT/FR2015/052697, filed Oct. 7, 2015, which in turn claims priority to French patent application number 1459738 filed Oct. 10, 2014. The content of these applications are incorporated herein by reference in their entireties.

The invention relates to a glazing unit providing heating and electromagnetic shielding functions.

The invention will more particularly be described with regard to these applications, although it is not however limited thereto.

A heating glazing unit is a glazing unit comprising electrically conductive means on one of the faces of the glazing unit, which means, when they are subjected to an electrical current, allow the temperature of the glazing unit to be increased. This type of glazing unit has applications in means of transportation or even in buildings, as a way of preventing or stopping the formation of condensation or frost on the glazing unit, or even stopping cold-wall effects being felt in proximity to the glazing unit.

The electrically conductive means of known heating glazing units consist of metal wires screen printed onto the glass or embedded into lamination interlayers, or of thin films deposited on the glass.

An electromagnetically shielding glazing unit is a glazing unit that decreases the propagation of electromagnetic waves therethrough. This application is of interest in the field of electronics, especially with respect to the production of electromagnetically shielding windows, also called electromagnetic filters, intended for example to be placed on the front side of plasma display screens. Another application relates to the aeronautical field in which there is a need to ensure the continuity of the electromagnetic shielding of aircraft, in order to prevent cell phones and portable computers of passengers from creating interference and disrupting links between flight personnel and control towers. Lastly, another application is that of the limitation of radar signature in the nautical and/or aeronautical fields.

Electromagnetic shielding is generally achieved by way of thin films or metal grids, deposited on the glass of the glazing unit or any other interface, the interlayer for example.

It is known to combine shielding and heating functions in a given glazing unit. In such a glazing unit, the electrically conductive means for the heating and the conductive shielding means are formed in combination, by virtue for example of a thin-film multilayer the nature and thicknesses of the deposited materials of which are selected to ensure both functions are provided.

However, the aforementioned glazing units have drawbacks.

Although metal grids are effective as regards electromagnetic shielding at low frequencies, they in contrast perform poorly beyond about ten GHz. However, certain applications require a significant performance, especially an attenuation higher than 50 dB, or even of about 60 dB and more, at frequencies of about or higher than 10 GHz.

Furthermore, metal grids induce substantial optical degradations in glazing units, degradations such as refraction defects causing diffraction patterns of substantial size to appear when point light sources (headlamps, lights, etc.) are observed; or indeed, in the case of association of two metal grids, Moiré effects may also appear when the glazing unit is looked through. However, the optical quality of a glazing unit is paramount.

With regard to the use of thin films, their accumulation degrades the luminous transmittance of the glazing unit, and increases manufacturing cost. In addition, such known glazing units, although they have very good visual properties, do not allow, with a single transparent conductive layer, attenuations higher than 40 dB to be obtained.

Lastly, it has been demonstrated that although a glazing unit equipped with two separate layers, i.e. a heating layer and an electromagnetically shielding layer as such, spaced apart and electrically insulated from each other, may perform well at certain frequencies, it would still be desirable to further improve performance at other frequencies, even if only by a few dB.

The aim of the invention is therefore to provide a glazing unit possessing both functions (heating and electromagnetic shielding) and providing attenuations higher than 40 dB for a wide range of frequencies, and even of about 60 dB for frequencies higher than 10 GHz, while nonetheless having very good visual properties.

According to the invention, the glazing unit providing heating and electromagnetic shielding functions, including at least one substrate (such as a glass sheet or a substrate made of plastic), a heating layer deposited on one of the faces of the substrate, and electromagnetically shielding means that comprise an electrically conductive coating taking the form of a (shielding) metal coating arranged on the periphery of the glazing unit, is characterized in that the metal coating covers a peripheral portion of the heating layer (7), said heating layer being electrically insulated from said coating by electrically insulating means.

During manufacture of the glazing unit, especially when the heating layer is formed by depositing silver, the heating layer is deposited in such a way that it does not extend as far as the edge of the substrate (does not extend to level with the edge face of the substrate). Thus, the face of the substrate comprising the heating layer is devoid of heating layer all the way around its periphery. Generally, the width (dimension transverse to the side of the glazing unit) of the substrate exempt from the heating layer is about 20 mm. However this width may locally reach a plurality of centimeters or even tens of centimeters for nonrectangular glazing units (for example of trapezoidal shape) provided with a heating layer of rectangular shape.

Advantageously, with the electrically insulating means intermediate (thicknesswise), the electrically conductive coating covers the heating layer and extends right round the periphery of the glazing unit.

The metal shielding coating partially covers the heating layer in the direction of the center of the glazing unit while being electrically insulated. It extends from the edge of the glazing unit in the direction of the center of the glazing unit, over a limited distance, especially over at most 1 cm.

The expression "cover" is in the context of the invention understood to mean facing in planes parallel to the general faces of the substrates.

The metal shielding coating is at least partially placed in the interior of the glazing unit. It is arranged on at least one of the internal faces of the glazing unit, on at least one of the internal faces of one of the substrates of the glazing unit.

Thus, for a multiple glazing unit, the metal shielding coating is at least partially placed in the interior of the glazing unit, on at least one of the internal faces of the substrates made of glass of the glazing unit.

The heating layer per se may depending on the nature of its materials also form one portion of the electromagnetically shielding means. Nevertheless, preferably, the electromagnetically shielding means furthermore comprise a transparent electromagnetically shielding layer separate from the heating layer and electrically insulated therefrom. This layer is for example made of metal and based on silver or a layer comprising semiconductors such as ITO (indium tin oxide).

According to the invention, the presence of the electrically conductive metal coating forming a portion of the electromagnetically shielding means of the glazing unit and its arrangement on the edge of the glazing unit, in particular in a zone devoid of said heating layer, and covering the heating layer while nonetheless remaining electrically insulated from the heating layer, ensures that very significant attenuations are obtained. Attenuations of about 50, or even 60 dB and higher, are very advantageously achieved, both for low frequencies of about 5 MHz and for high frequencies, frequencies higher than 10 GHz.

In one preferred embodiment, the heating layer covers almost all of the substrate except for a peripheral zone, which is for example about 10 mm wide, at the very edge of the glazing unit. The electromagnetically shielding peripheral coating covers this peripheral zone while nonetheless remaining electrically insulated from the heating layer. Thus, the heating layer optimally covers the surface of the glazing unit, only at least the peripheral edge that is exempt therefrom, for example over a few 10 mm, being covered by the electrically conductive coating according to the invention.

The electrically conductive coating of the invention may be an opaque or transparent coating. It is a metal coating. It is for example made of copper. To this coating on the glazing unit, the coating for example takes the form of an adhesive.

By limiting the width of the electrically conductive metal coating to the zone exempt from heating layer and the coverage to partial coverage of the heating layer (with intermediate thicknesswise, the electrical insulator)—the coverage for example being limited to about 1 cm—the field of view of the glazing unit is not degraded and the attenuation of waves is significantly improved.

Advantageously, the coverage of the heating layer by said electrically conductive coating, widthwise in the direction of the center of the glazing unit, is comprised between a few millimeters and a few centimeters and in particular is about one centimeter.

The glazing unit includes electrically insulating means between the heating layer and the electrically conductive coating forming a portion of the electromagnetically shielding means. These electrically insulating means are for example made of plastic, and take the form of one or more interlayer films extending right over the heating layer or are formed from a film of limited width extending from the edge face of the glazing unit and stopping so as to cover the heating layer a distance away from the edge face of the glazing unit. The interlayer film of limited width is preferably an adhesive.

The expression "film" is understood to mean a separating means that has a thickness smaller than the thickness of a glass substrate.

The thickness of said electrically insulating means (dimension transverse to the general surface of the glazing unit and extending through the thickness of the glazing unit) is about one millimeter or less.

The electrically insulating means partially cover the heating layer by extending toward the interior of the glazing unit. The widthwise extent of said electrically insulating means is at least equal to or preferably larger than the widthwise coverage of the electrically conductive coating. The widthwise extent of said electrically insulating means is for example about 1.5 cm whereas the electrically conductive coating merely covers a width of 1 cm.

In one exemplary embodiment, the glazing unit includes two glass sheets and a plastic interlayer joining the two glass sheets, and the electrically insulating means between the heating layer and the electrically conductive coating are then the plastic interlayer separating the two glass sheets. The interlayer that covers the superficial extent of the glazing unit may be a mono- or multi-layer, i.e. comprise one interlayer film or a stack of films.

As known, an interlayer film is for example made of polyvinyl butyral (PVB) and has a thickness of 0.76 mm.

In another exemplary embodiment, which may be preferred, the plastic electrically insulating means are a thin adhesive film that is a few tens of microns and in particular 20 µm thick. This film is adhesively bonded to the heating layer, and preferably is limited widthwise between a distal end, corresponding to the edge face of the glazing unit, and its opposite end stopped at most a few centimeters from the edge.

According to one feature, the electromagnetically shielding means furthermore comprise an electromagnetically shielding layer as such (which is an electrically conductive layer, in particular made of metal or semiconductors), which is deposited on a face of the substrate other than the face bearing the heating layer or on a substrate other than that bearing the heating layer if the glazing unit includes a plurality of substrates.

Such as already stated above, although the heating layer does not ordinarily cover all of the substrate, it is nevertheless preferable for it to be deposited on almost all of one surface excepting only a few peripheral millimeters, so as to minimize the extent of the electromagnetically shielding, electrically conductive coating in the visual zone of the glazing unit. It is also preferable to minimize the heating resistance of the heating layer and thus increase the improvement in attenuation.

The nature of the heating layer and the nature of the electromagnetically shielding layer when the latter is present and will advantageously be optimized in order to decrease as much as possible the (sheet) resistance per square of each layer. Common glazing units comprise heating and/or shielding layers each layer of which has a total resistance of at least $10\Omega/\square$, preferably lower than $2\Omega/\square$ or even lower than $1\Omega/\square$.

In addition, when an electromagnetically shielding layer as such is added to the heating layer, the two shielding and heating layers are spaced apart by a set thickness in order to optimize the shielding. This electrically insulating thickness is for example of about a few millimeters to a few centimeters depending on the nature of the insulators (glass or plastic or gas).

In one preferred embodiment of the glazing unit, the latter includes at least two glass sheets and an interlayer separating the two glass sheets, this interlayer possibly being a gas-filled cavity and/or a sheet of plastic of the type made of PVB, a heating layer and the electromagnetically shielding electrically conductive coating, and an electromagnetically shielding layer, the electromagnetically shielding layer being associated with one of the glass sheets and arranged between the two glass sheets, whereas the heating layer is deposited on the other glass sheet and on the exterior face opposite that associated with the interlayer. The heating layer associated with the electromagnetically shielding, electrically conductive coating may be covered with a protective protecting film made of plastic, or with a thin protective layer known per se, or even be laminated with a third glass sheet.

The glazing unit may have various applications in the field of electromagnetic shielding. It is for example used in the aeronautical, nautical, terrestrial automotive (trucks, buses, automobiles, tanks, etc.), or architectural fields.

The present invention is now described using merely illustrative and nonlimiting examples of the scope of the invention, and by way of the appended illustrations, in which.

The drawings are not to scale for the sake of legibility.

Figure 1:
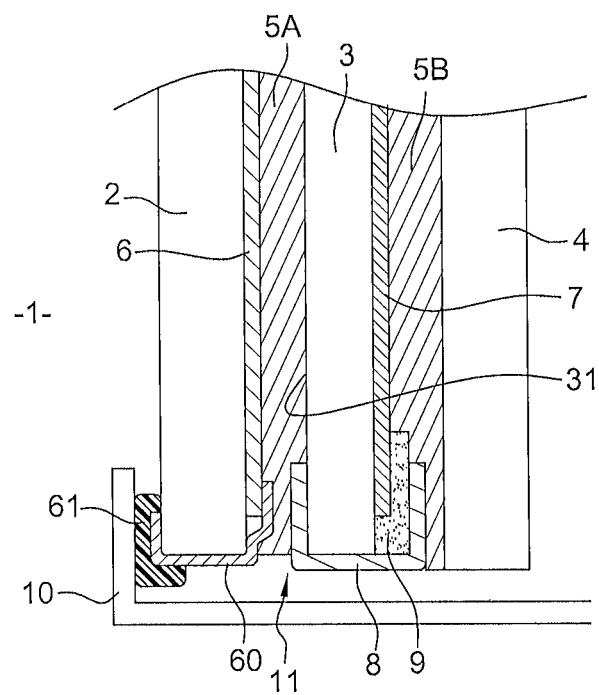
FIG. 1 shows a partial cross-sectional view of an exemplary glazing-unit embodiment according to the invention.

FIG. 1 illustrates a heating and electromagnetically shielding glazing unit 1 according to the invention.

By way of completely nonlimiting example, the glazing unit 1 is a laminated glazing unit and includes: three substrates taking the form of glass sheets 2, 3 and 4 joined together in a known way by two plastic interlayers, 5A and 5B, respectively, made of PVB; a conventional electromagnetically shielding layer 6 having as such the electromagnetic shielding function (having a sheet resistance at least lower than 10Ω/□, or even lower than 2Ω/□; a heating layer 7 (having a sheet resistance at least lower than 10Ω/□, or even lower than 2Ω/□) possibly forming electromagnetically shielding means because able, because of the nature of its materials, to contribute to the electromagnetic shielding function; and, according to the invention, an electrically conductive coating 8 forming a portion of the electromagnetically shielding means.

The glazing unit could be a thermally insulating glazing unit, the glass sheets then being separated by gas-filled cavities. The insulating glazing unit could also comprise films made of plastic.

The number of substrates and the interlayer means will be chosen depending on the nature of and the type of functions to be provided by the glazing unit. The substrates described here are made of glass, but they could be made of a plastic such as polymethyl methacrylate (PMMA) or polycarbonate (PC).

To provide the electromagnetic shielding function, the glazing unit therefore includes the electrically conductive layer 6 covering one of the faces of one of the glass sheets, preferably face (2) of the glazing unit.

It will be recalled that the faces of a laminated glazing unit equipped with two glazing substrates are conventionally numbered (1), (2), (3) and (4) starting from the exterior environment of the glazing unit and counting toward the interior of a compartment/dwelling when the glazing unit is fitted into a structural opening so as to close said compartment/dwelling.

The shielding layer 6 is a transparent electrically conductive coating such as a thin layer based on indium tin oxide (ITO) or silver.

The shielding layer 6 is electrically connected to the electrically conductive chassis 10 of the frame in which the glazing unit is housed. The frame 10 is intended to be fitted in the structural opening of the compartment/dwelling to be closed by a glazing unit. The electrical connection between the shielding layer 6 and the frame 10 is achieved in a known way, for example by an electrically connecting adhesive 60 adhesively bonded to the layer and folded over the glazing substrate 2 and by an electrically conductive seal 61 ensuring the electrical connection between the adhesive 60 and the metal frame 10.

To provide the heating function, the glazing unit includes a heating layer 7 deposited a distance away from the shielding layer 6, and preferably arranged on face (4) of the glazing unit. The heating layer 7 is preferably made from silver or ITO.

The heating layer 7 is ordinarily protected, Depending on the type of glazing unit, as in the illustrated example, the glazing unit includes a third substrate 4 laminated with the second substrate 3, the layer 7 being protected by the interlayer film 5B. In configurational variants of the glazing unit, the glazing unit could comprise only two substrates, the heating layer 7 then being protected by a plastic protective film coating or by the deposition of a thin protective layer known per se and that is not electrically conductive. The aforementioned protective anti-scratch layer will be used only if the heating layer of the glazing unit is powered by none other than low voltages.

Preferably, the heating layer 7 covers all of the glazing face of the substrate 3. Nevertheless, as is conventionally the case in the deposition of thin films, the heating layer does not extend as far as the edge of the glazing unit, i.e. as far as to level with the edge face 11 of the glazing unit.

According to the invention, the glazing unit includes additional electromagnetically shielding means 8.

These additional electromagnetically shielding means 8 are associated with the heating layer 7 while being electrically insulated from said layer by insulating means 9.

These additional electromagnetically shielding means 8 are made from a metal coating such as an electrically conductive adhesive, for example one made of copper.

Figure 2:
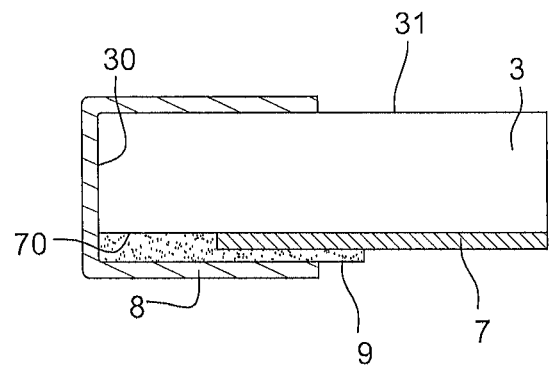
FIG. 2 is an enlarged cross-sectional view of one portion of FIG. 1, showing the electromagnetically shielding peripheral coating and the heating layer.

With regard to the detail view in FIG. 2, the coating 8 is placed facing the layer 7 and covers said layer, while being separated from said layer by the insulating means 9.

In the illustrated exemplary embodiment, on the one hand, the coating 8 extends, in particular about one centimeter, over the heating layer in the direction of the center of the glazing unit, thereby partially covering the layer, and on the other hand, the coating 8 runs as far as the edge face 30 of the glass sheet 3, caps it and partially covers face (3) of the glazing unit corresponding to the face opposite the face bearing the heating layer 7. The coverage of face (3) extends facing the coverage of the heating layer 7 and is limited to the width of the latter. The coating 8 has a U-shape in this example.

According to the invention, it is important, as regards the zone 70 of face (4) of the glazing unit bearing the heating layer 7, i.e. the zone exempt of heating layer, for the additional electromagnetically shielding means 8 to be able to cover this zone even with the presence of an insulating interface 9.

In variant embodiments, the additional electromagnetically shielding means (electrically conductive coating) 8 could extend only as far as the edge of the glazing unit, to the limit of the edge face 30 and/or not cover that face of the substrate which is opposite the face bearing the heating layer 7.

The metal coating 8 forming the additional electromagnetically shielding means is not necessarily electrically connected either to the electromagnetically shielding layer 6 or to the metal frame of the glazing unit.

Furthermore, it is imperative for the additional electromagnetically shielding means 8, which are electrically conductive, not to make direct contact with the heating layer 7. It is for this reason that the electrically insulating means 9 are interposed between the heating layer 7 and the metal coating 8.

In the exemplary embodiment presented, these electrically insulating means 9 are formed from a thin adhesive made of polyethylene terephthalate (PET) of 20 μm thickness. They extend over the heating layer over a width at least as long as the coating 8. They stop at the edge of the edge face 30 of the glass sheet 3.

The glazing unit illustrated is manufactured in the following way:
- the shielding 6 and heating 7 layers, were deposited beforehand on glazing substrates that had not yet been joined together;
- the PET insulating adhesive 9 was deposited on the heating layer 7;
- the conductive coating 8 is deposited on the insulating adhesive 9; this is a copper adhesive that is adhesively bonded to the adhesive 9, the edge face 30 of the glass sheet and the opposite face 31 of the glass sheet; and
- the two glass sheets 2 and 3 and the third glass sheet are joined together in an autoclave with PVB sheets 5A and 5B.

Figure 3A:
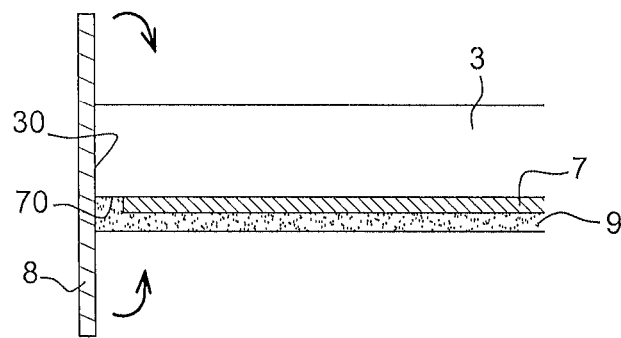
FIGS. 3a to 3c illustrate the manufacturing steps of one variant embodiment of the glazing unit of the invention.
Figure 3B:
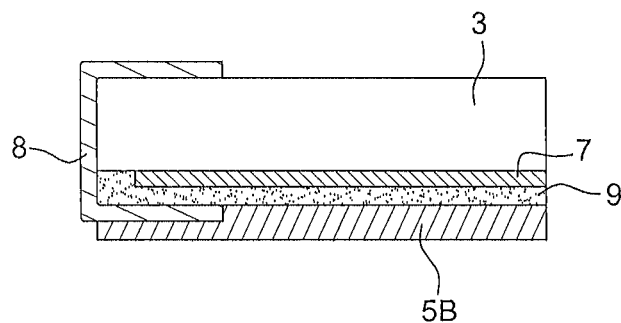
Figure 3C:
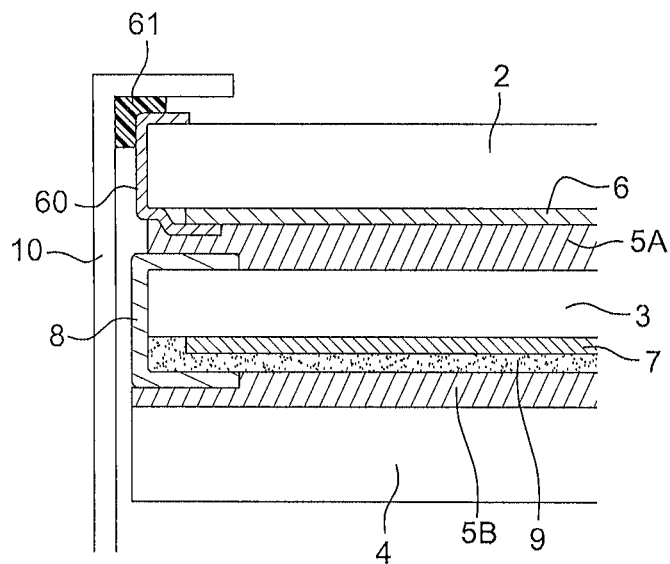

In one variant embodiment, illustrated in FIG. 3c, as regards the nature of the insulating means 9, the latter are formed by one or more interlayer films that extend right over the heating layer 7.

More particularly, the manufacturing process is as follows.

With regard to FIG. 3a, on the second glazing substrate 3 bearing the heating layer 7, an interlayer film 9 has been securely fastened. Then the electrically conductive adhesive 8 is adhesively bonded to the edge face 30 of the substrate 3. The electrically conductive adhesive 8 is folded along the arrows onto the two faces of the substrate 3.

Once folded such as illustrated in FIG. 3b, the electrically conductive adhesive 8 is covered on the same side as the heating layer 7 with the interlayer film 5B.

Lastly, with regard to FIG. 3c, the second substrate 3 is securely fastened, on the one hand, via the interlayer film 5A to the first substrate 2 on which the electromagnetically shielding layer 6 has been deposited, and, on the other hand, to the third substrate 4 via the interlayer film 5B.

The plastic interlayer films 5A and 5B may be monolayered or multilayered.

The glazing unit of the invention achieves noteworthy results as regards the attenuation of electromagnetic waves and also has excellent optical properties, with a degree of luminous transmittance (TL) higher than 70% and an absence of diffraction.

Figure 4:
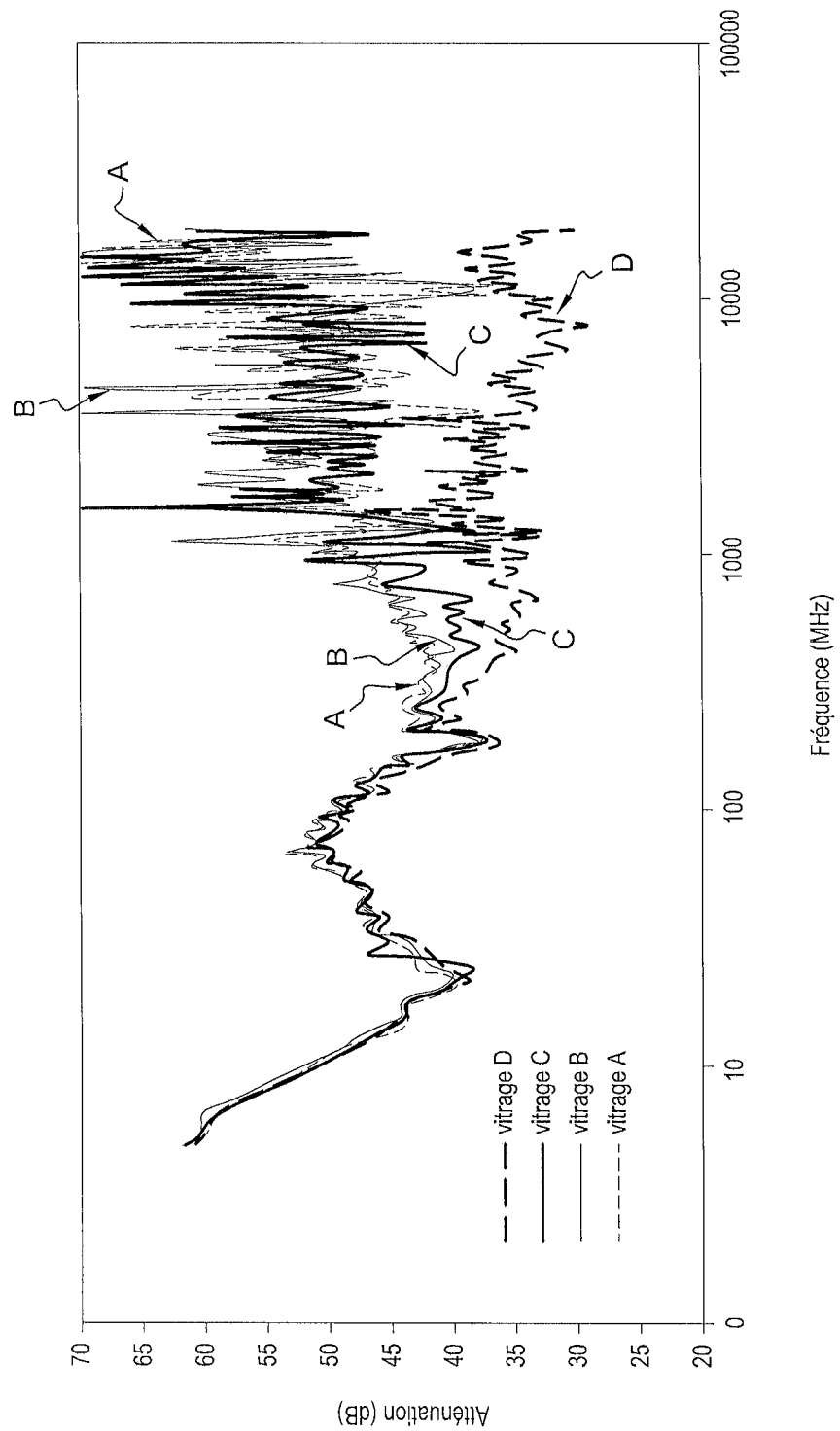
FIG. 4 illustrates the attenuation curves of two exemplary glazing units of the invention and of two comparative examples.

FIG. 4 illustrates attenuation curves in dB for three glazing units:
- A glazing unit A of the invention which is the glazing unit described above according to the first exemplary embodiment with regard to the insulating means 9. The glazing unit A includes glazing substrates 2, 3 and 4 of 4 mm thickness and two PVB interlayers 5A of 1.52 mm thickness and 5B of 3.04 mm thickness, respectively; a conventional shielding layer 6; a conventional heating layer 7; and, according to the invention, a copper adhesive 8 here of 50 μm thickness extending facing the heating layer over a width of 1 cm; and insulating means 9 formed by a 20 μm-thick PET adhesive.
- A glazing unit B having the same features as the glazing unit A except that the insulating means 9 are formed by an interlayer film of 1.52 mm thickness.
- A comparative glazing unit C identical to the glazing units A and B (with regard to the location and nature of the heating and electromagnetically shielding layers) but devoid of shielding coating 8 and insulating means 9.
- A comparative glazing unit D comprising only one electromagnetically shielding layer identical to that present in the glazing units A, B and C and arranged between two glazing substrates and 4 mm thickness and joined together by an interlayer film of 1.52 mm thickness.

The attenuation measurements were carried out according to standard GAM T20 (September 1992).

The glazing unit D (bottommost curve) comprising only the single electromagnetically shielding layer exhibits a significantly poorer performance than the other glazing units. Furthermore, for frequencies from 200 MHz (bottommost curve), the attenuation obtained is lower than 40 dB.

The glazing unit C demonstrates that the heating layer, which is a layer based on conductors such as ITO, also contributes to the electromagnetic shielding. Thus it may be observed that the attenuation is higher than for the glazing unit D. However, the attenuation remains lower or substantially lower than the attenuation obtained by the two glazing units A and B of the invention for the entire spectrum of frequencies, whether this be between 10 and 200 MHz, or between 200 and 10 000 MHz or beyond 10 GHz.

For frequencies below 200 MHz, or comprised between 200 and 1 000 MHz, even though the attenuation gradient is a few dB (1 to 5 dB) between the comparative glazing unit C and the glazing units A and B, these few dB of improvement by virtue of the peripheral shielding coating according to the invention are very significant for certain applications.

For frequencies higher than 1000 MHz (1 GHz) and even the high frequencies higher than 10 GHz, attenuations higher than 50 dB, and even values higher than 60 dB, are obtained with the glazing units A and B of the invention.

Although the attenuation obtained with the glazing unit C is quite close to that of the glazing units of the invention for frequencies higher than 1 GHz, the attenuation of the glazing unit C remains for most of these frequencies below that of the glazing units A and B (by about 1 to 3 dB).

The glazing units of the invention thus provide the required performance over the very wide range of frequencies from 10 MHz to higher than 10 GHz:
- an attenuation higher than 40 dB for the aforementioned range of frequencies;
- an attenuation higher than 45 dB for frequencies between 30 MHz and 150 MHz and beyond 500 MHz;
- an attenuation higher than 50 dB for frequencies beyond 1 GHz, of about 55 dB on average;
- an attenuation comprised between 55 and 65 dB for frequencies beyond 10 GHz; and
- an improvement in attenuation that may be as much as about 5 dB with regard to the glazing unit C equipped with heating and shielding layers, and of more than 5 dB, or even of about 10 dB, with regard to the glazing unit D equipped with the electromagnetically shielding layer alone.

The invention claimed is:

1. A glazing unit providing heating and electromagnetic shielding functions, comprising at least one substrate, a heating layer deposited on one of the faces of the substrate, and an electromagnetic shield that comprises an electrically conductive coating taking the form of a metal coating arranged on a periphery of the glazing unit, wherein the metal coating covers a portion of the heating layer, said heating layer being electrically insulated from said metal coating by one or more electrically insulating components.

2. The glazing unit as claimed in claim 1, wherein, with the one or more electrically insulating components intermediate, the electrically conductive coating covers the heating layer and extends right round the periphery of the glazing unit.

3. The glazing unit as claimed in claim 1, wherein the heating layer covers said one of the faces of the substrate except for a peripheral zone at an edge of the glazing unit, the electrically conductive coating covering said peripheral zone while nonetheless remaining electrically insulated from the heating layer.

4. The glazing unit as claimed in claim 1, wherein a coverage of the heating layer by said electrically conductive coating, widthwise in a direction of a center of the glazing unit, is comprised between 2 millimeters and 2 centimeters.

5. The glazing unit as claimed in claim 1, wherein the metal coating is opaque.

6. The glazing unit as claimed in claim 1, wherein the electrically conductive coating takes the form of an adhesive.

7. The glazing unit as claimed in claim 1, wherein the heating layer forms a portion of the electromagnetic shield.

8. The glazing unit as claimed in claim 1, wherein the electromagnetic shield comprises an electromagnetically shielding layer separate from the heating layer and electrically insulated therefrom.

9. The glazing unit as claimed in claim 1, wherein the one or more electrically insulating components between the heating layer and the electrically conductive coating are made of plastic.

10. The glazing unit as claimed in claim 1, wherein the one or more electrically insulating components are made of an electrical insulator and are formed from one or more interlayer films extending right over the heating layer or are formed from a film of limited width extending from the edge face of the glazing unit and stopping so as to cover the heating layer a distance away from the edge face of the glazing unit.

11. The glazing unit as claimed in claim 1, wherein a widthwise extent of the one or more electrically insulating components is at least equal to a widthwise coverage of said electromagnetically shielding, electrically conductive coating.

12. The glazing unit as claimed in claim 1, wherein the electromagnetically shield includes an electrically conductive electromagnetically shielding layer that is deposited on a face of the substrate other than the face bearing the heating layer or on a substrate other than that bearing the heating layer if the glazing unit includes a plurality of substrates.

13. The glazing unit as claimed in claim 1, further comprising at least two glass sheets and an interlayer separating the two glass sheets, said interlayer being a gas-filled cavity and/or a sheet of plastic of the type made of PVB, the heating layer and the electromagnetically shielding electrically conductive coating, and an electromagnetically shielding layer, the electromagnetically shielding layer being associated with one of the glass sheets and arranged between the two glass sheets, whereas the heating layer is deposited on the other glass sheet and on an exterior face opposite that associated with the interlayer.

14. The glazing unit as claimed in claim 13, wherein the heating layer is covered with a protective protecting film made of plastic, or with a thin protective layer, or even is laminated with a third glass sheet.

15. The glazing unit as claimed in claim 1, wherein the glazing unit is used in the aeronautical, nautical, terrestrial automotive, or architectural fields.

16. The glazing unit as claimed in claim 4, wherein the coverage of the heating layer by said electrically conductive coating is one centimeter.

17. The glazing unit as claimed in claim 5, wherein the metal coating is based on copper.

18. The glazing unit as claimed in claim 10, wherein the one or more electrically insulating components are made of plastic.

19. The glazing unit as claimed in claim 10, wherein the film of limited width is an adhesive.

20. The glazing unit as claimed in claim 11, wherein the widthwise extent of the one or more electrically insulating components is larger than the widthwise coverage of said electromagnetically shielding, electrically conductive coating.

21. The glazing unit as claimed in claim 1, wherein the one or more insulating components are made of one or more films.

* * * * *